United States Patent
Bandholz et al.

(10) Patent No.: US 8,390,393 B2
(45) Date of Patent: Mar. 5, 2013

(54) PRE-DISTORTION BASED IMPEDENCE DISCONTINUITY REMEDIATION FOR VIA STUBS AND CONNECTORS IN PRINTED CIRCUIT BOARD DESIGN

(75) Inventors: Justin P. Bandholz, Cary, NC (US); Moises Cases, Austin, TX (US); Robert J. Christopher, Chapel Hill, NC (US); Daniel de Araujo, Cedar Park, TX (US); Bradley D. Herrman, Cary, NC (US); Erdem Matoglu, Austin, TX (US); Bhyrav M. Mutnury, Austin, TX (US); Pravin S. Patel, Cary, NC (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,386

(22) Filed: Sep. 4, 2012

(65) Prior Publication Data

US 2012/0327622 A1 Dec. 27, 2012

Related U.S. Application Data

(62) Division of application No. 11/737,196, filed on Apr. 19, 2007, now Pat. No. 8,289,101.

(51) Int. Cl.
*H03H 7/38* (2006.01)

(52) U.S. Cl. .......................................... 333/33; 333/28 R
(58) Field of Classification Search .................... 333/32, 333/33, 17.3, 28 R, 18; 375/229–235
See application file for complete search history.

(56) References Cited

U.S. PATENT DOCUMENTS

2007/0018752 A1* 1/2007 Miller ............................. 333/33

* cited by examiner

*Primary Examiner* — Stephen Jones
(74) *Attorney, Agent, or Firm* — Steven M. Greenberg, Esq.; Carey, Rodriguez, Greenberg & O'Keefe

(57) ABSTRACT

Embodiments of the present invention address deficiencies of the art in respect to via structure utilization in a PCB design and provide a novel and non-obvious method, system and computer program product for impedance discontinuity remediation for via stubs and connectors in a PCB. In one embodiment a method for impedance discontinuity remediation in a PCB can be provided. The method can include configuring a pre-distortion filter to negate an impedance discontinuity in an electrical signal caused by a transmission line with one of a via stub or a connector. The method further can include pre-distortion filtering an electrical signal before transmitting the electrical signal over the transmission line. Finally, the method can include transmitting the pre-distortion filtered electrical signal over the transmission line.

4 Claims, 2 Drawing Sheets

PRE-DISTORTION BASED IMPEDENCE DISCONTINUITY REMEDIATION FOR VIA STUBS AND CONNECTORS IN PRINTED CIRCUIT BOARD DESIGN

This application is a Divisional of U.S. application Ser. No. 11/737,196, filed Apr. 19, 2007, entitled "PRE-DISTORTION BASED IMPEDENCE DISCONTINUITY REMEDIATION FOR VIA STUBS AND CONNECTORS IN PRINTED CIRCUIT BOARD DESIGN," the entirety of which is incorporated herein by reference.

BACKGROUND OF THE INVENTION

1. Field of the Invention

The present invention relates to the field of high-performance printed circuit board (PCB) design and more particularly to via stub and connector performance management in PCB design.

2. Description of the Related Art

Interconnects are PCB design structures intended to reliably transmit high-speed serial signals from component to component in a PCB. Transmission lines, vias, and connectors form the basic building blocks of the interconnect design. Each of the transmission lines, vias and connectors can be configured at design time to satisfy desired metrics. Subsequently, the combination can be physically assembled into a PCB system-level interconnect. The most common PCB transmission structures include microstrip and stripline transmission lines. Single-ended lines also have been successfully utilized for lower speed PCB designs, whereas modern gigabit designs utilize differential signaling due to associated substantial noise immunity and reliable current return path characteristics.

Vias are integral to the PCB design in that vias facilitate the routing of circuit traces between layers of a multilayer board. Vias have proven particularly useful for transitioning from the pins of a ball grid array or connector down to stripline traces within the PCB. The most common and inexpensive via structure is the "through-hole" via, while alternatives to the through-hole via include the blind via and the back-drilled via. Although the blind via and the back-drilled via generally provide higher performance, most high-volume designs use the lower cost through-hole via. Importantly, central to the utilization of the PCB via structure is the unterminated via stub.

In this regard, PCB designs can succeed or fail depending on the choice of route layer and resultant via stub length. Specifically, when supporting a branched point-to-point signal path, a via stub can form a quarter wave resonant circuit where one end of the stub contains an open high impedance discontinuity while the other end of the stub contains a low impedance discontinuity where the trace and the via structure meet. The impedance mismatch can form a resonant structure in which a signal reflects back and forth between the boundaries of the structure. As a result, the reflection can remove energy from the signaling path at high frequencies causing a resonant trough at a specific frequency. The resonance caused by the stub can be detrimental to signal quality and whole PCB designs have been ruined by improper via design and routing.

BRIEF SUMMARY OF THE INVENTION

Embodiments of the present invention address deficiencies of the art in respect to interconnect utilization in a PCB design and provide a novel and non-obvious method, system and computer program product for impedance discontinuity remediation for via stubs and connectors in a PCB. In one embodiment a method for impedance discontinuity remediation for via stubs and connectors in a PCB can be provided. The method can include configuring a pre-distortion filter to negate an impedance discontinuity in an electrical signal caused by a transmission line with via stub or another connector. The method further can include pre-distortion filtering an electrical signal before transmitting the electrical signal over the transmission line. Finally, the method can include transmitting the pre-distortion filtered electrical signal over the transmission line.

In another embodiment of the invention, a PCB can be configured for impedance discontinuity remediation for transmission line via stubs. The PCB can include PCB components interconnected across different trace layers in the PCB. The PCB further can include a transmission driver communicatively coupled to a receiver over a transmission line comprising a via connecting two of the trace layers of the PCB and terminating in a via stub. Finally, the PCB can include a pre-distortion finite input response (FIR) filter coupled to the transmission driver. The FIR filter can include a transfer function inverting an error response for the transmission line. The FIR filter further can include coefficients selected for peaking maximum energy in a produced pulse shape.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Embodiments of the present invention provide a method, system and computer program product for impedance discontinuity remediation for via stubs and other connectors. In accordance with an embodiment of the present invention, the signal characteristics of a signal transmitted across a transmission line with via stub or connector in a PCB can be monitored and the signal frequencies at which over attenuation occurs can be determined. An inverse frequency response can be computed based each of the determined signal frequencies. Thereafter, a pre-distortion FIR filter disposed prior to the transmission line with via stub in the PCB can be configured with the inverse frequency response. Consequently, signals can be inversely pre-distorted prior to transmission across the transmission line so as to remediate the impedance discontinuity caused by the via stub or connector.

Figure 1:
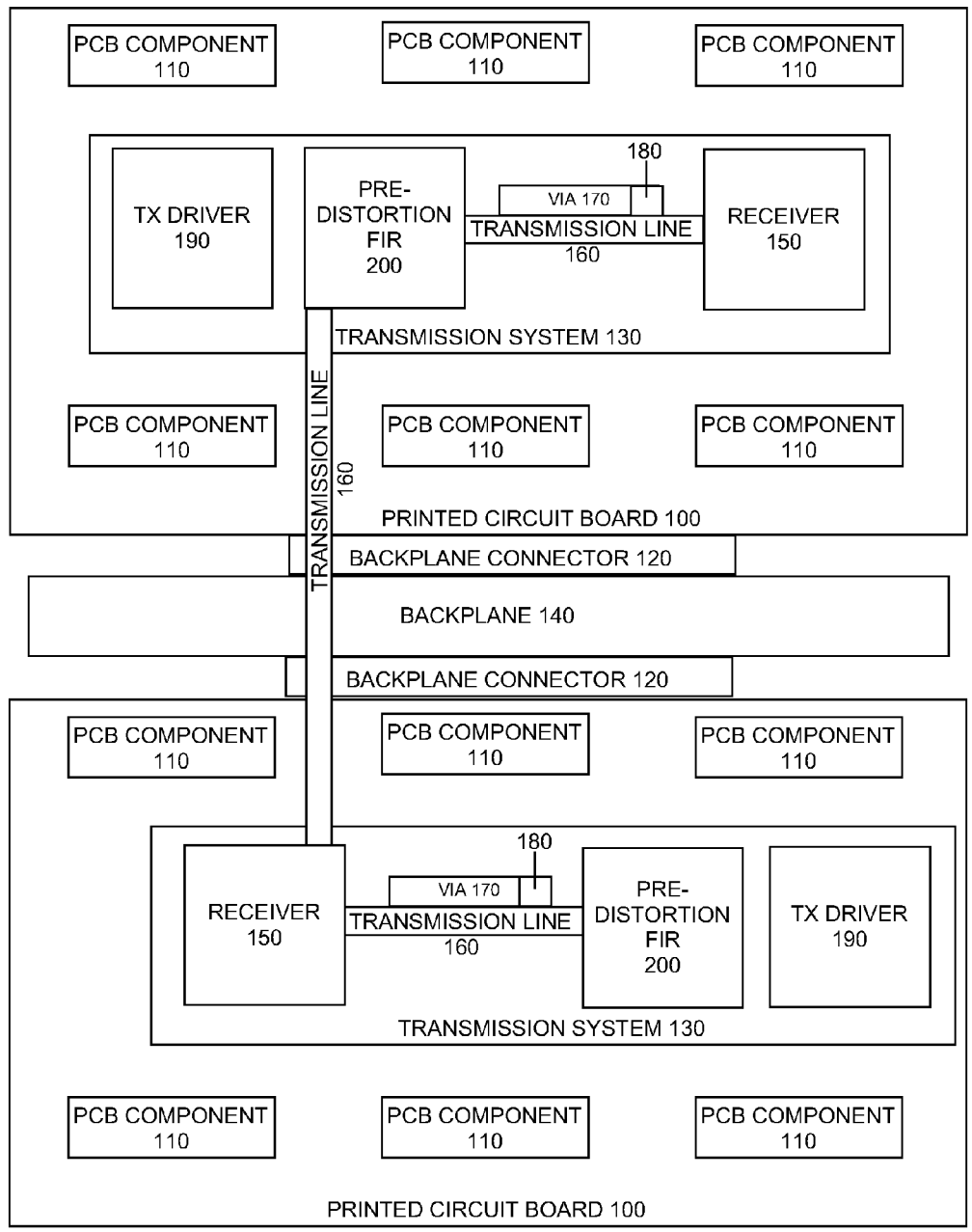
FIG. 1 is a schematic illustration of a PCB system configured for impedance discontinuity remediation for via stubs and connectors.

In illustration, FIG. 1 is a schematic illustration of a PCB system configured for impedance discontinuity remediation for via stubs. The PCB system can include a PCB 100 supporting the interconnection and operation of multiple different PCB components 110. Different transmission lines (not shown) can connect the different PCB components 110 so as to enable the passage of electrical signals between the different PCB components 110. Additionally, a backplane connector 120 can be provided to enable communication between the PCB components 100 and a computing system over a backplane 140.

Notably, at least one transmission line 160 can incorporate a via 170 between different trace layers (not shown) in the PCB 100. The via 170 can result in a via stub 180 in which an impedance discontinuity can occur when transmitting electrical signals across the via 170. To remediate the impedance discontinuity occurring when transmitting electrical signals across the via 170, an impedance discontinuity transmission system 130 can be provided in the PCB 100. The impedance discontinuity transmission system 130 can include both a transmission driver 190 and a pre-distortion FIR filter 200 coupled to the transmission line 160. The transmission driver 190 can be configured to transmit an electrical signal through the pre-distortion FIR filter 200 across the transmission line 160 including via 170 to receiver 150. Additionally, the transmission driver 190 can be communicatively coupled through the pre-distortion FIR filter 200 to the receiver 150 over a channel including multiple PCB cards.

Figure 2:
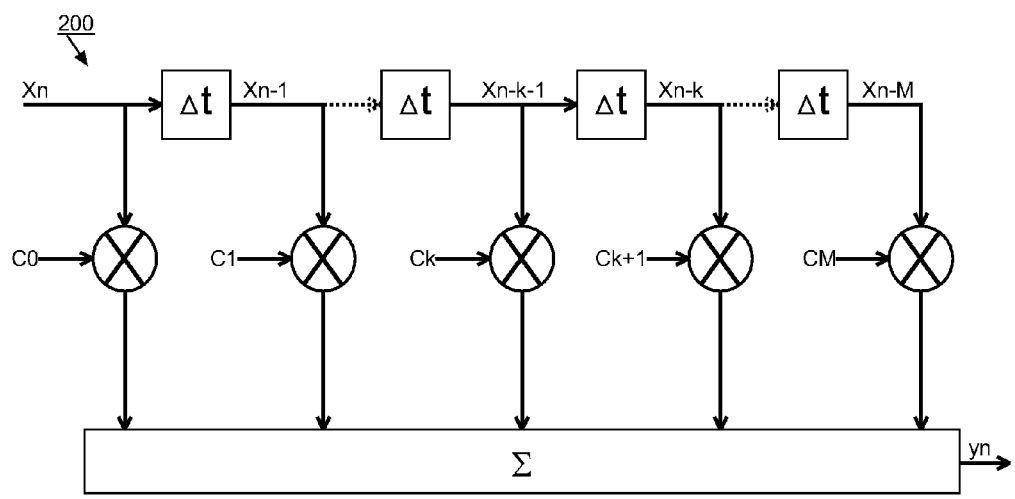
FIG. 2 is a block diagram illustrating a finite impulse response (FIR) pre-distortion filter for the PCB system of FIG. 1; and, FIG. 3 is a flow chart illustrating a process for impedance discontinuity remediation for via stubs in the PCB system of FIG. 1.

Notably, the pre-distortion FIR filter 200 can pre-distort the outbound electrical signal so as to negate the consequence of the impedance discontinuity experienced as a result of the via stub 180 or the backplane connector 120. In further illustration, FIG. 2 is a block diagram illustrating a FIR pre-distortion filter for the PCB system of FIG. 1. The pre-distortion FIR filter 200 can be configured with a transfer function according to the error response of the transmission line in the absence of the FIR filter 200. The error response can be computed as the difference between the desired response and the actual response of the transmission line. The coefficients of the FIR filter 200 further can be computed by applying an inverse Fourier transform to the error response. Thereafter, the FIR filter 200 can be constructed to implement $$y_n = \sum_{k=0}^{M} x_{n-k} * C_k.$$

Figure 3:
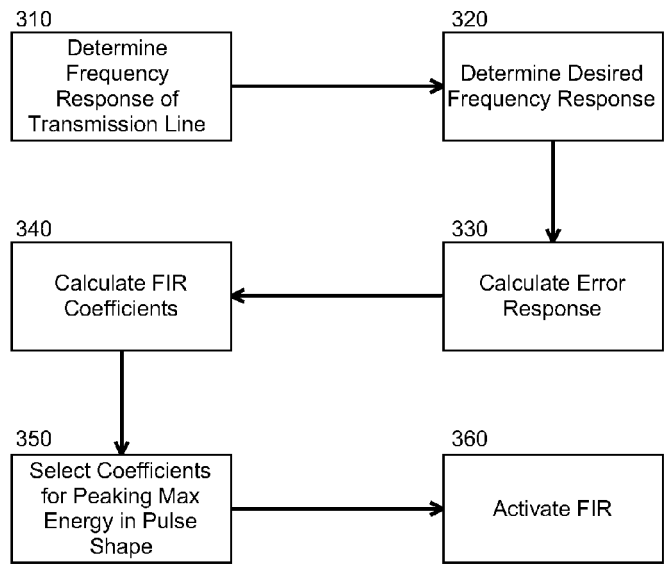

In yet further illustration, FIG. 3 is a flow chart illustrating a process for impedance discontinuity remediation for via stubs and connectors in the PCB system of FIG. 1. Beginning in block 310, the frequency response of the transmission line with via stubs can be measured in the absence of the pre-distortion FIR filter. The measured frequency response can include both amplitude and phase data. In block 320, the desired frequency response of the transmission line can be determined, including both amplitude and phase. Thereafter, in block 330, the error response can be computed, in both amplitude and phase, as the ratio of the desired frequency response of the transmission line to the measured frequency response the transmission line with via stubs.

In block 340, coefficients for the pre-distortion FIR filter can be computed. The coefficients can be computed by applying an inverse Fourier transform to the error response. In block 350, the coefficients produced by the inverse Fourier transform can be selected based upon peaking maximum energy in the resulting pulse shape. Finally, the selected coefficients can be applied to the pre-distortion FIR filter and the pre-distortion FIR filter can be activated for use in transmitting electrical signals across the transmission line with via stubs.

Embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, and the like. Furthermore, the invention can take the form of a computer program product accessible from a computer-usable or computer-readable medium providing program code for use by or in connection with a computer or any instruction execution system.

For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

We claim:

1. A printed circuit board (PCB) configured for impedance discontinuity remediation for transmission line via stubs, the PCB comprising:
   a plurality of PCB components interconnected across different trace layers in the PCB;

a transmission driver communicatively coupled to a receiver over a transmission line comprising a via connecting two of the trace layers of the PCB and terminating in a via stub; and, a pre-distortion finite input response (FIR) filter coupled to the transmission driver, the filter comprising a transfer function inverting an error response for the transmission line.

2. The PCB of claim 1, wherein the FIR filter comprises coefficients selected for peaking maximum energy in a produced pulse shape.

3. The PCB of claim 1, wherein the error response comprises a difference between a desired frequency response for the transmission line and a frequency response for the transmission line.

4. The PCB of claim 1, further comprising a backplane connector for connecting to a backplane in a computing system.

* * * * *